(12) United States Patent
Xiao et al.

(10) Patent No.: US 10,571,751 B2
(45) Date of Patent: Feb. 25, 2020

(54) MASK PLATES AND PHOTO SPACERS AND METHODS FOR PREPARING THE SAME AND DISPLAY PANELS

(71) Applicants: BOE TECHNOLOGY GROUP CO., LTD., Beijing (CN); BEIJING BOE DISPLAY TECHNOLOGY CO., LTD., Beijing (CN)

(72) Inventors: Yu Xiao, Beijing (CN); Dong Wang, Beijing (CN); Yongzhi Song, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 167 days.

(21) Appl. No.: 15/552,017

(22) PCT Filed: Jan. 23, 2017

(86) PCT No.: PCT/CN2017/072194
§ 371 (c)(1),
(2) Date: Aug. 18, 2017

(87) PCT Pub. No.: WO2017/211090
PCT Pub. Date: Dec. 14, 2017

(65) Prior Publication Data
US 2019/0121179 A1 Apr. 25, 2019

(30) Foreign Application Priority Data

Jun. 8, 2016 (CN) .......................... 2016 1 0405123

(51) Int. Cl.
*G03F 1/50* (2012.01)
*G03F 1/80* (2012.01)
(Continued)

(52) U.S. Cl.
CPC ...... *G02F 1/1339* (2013.01); *G02F 1/133512* (2013.01); *G02F 1/133514* (2013.01);
(Continued)

(58) Field of Classification Search
CPC . G03F 1/50; G03F 1/80; G03F 7/2002; G02F 1/13394
(Continued)

(56) References Cited

U.S. PATENT DOCUMENTS 7,344,806 B2 3/2008 Yoshikawa et al.
2005/0048377 A1 3/2005 Yang
(Continued)

FOREIGN PATENT DOCUMENTS

CN 101211118 A 7/2008
CN 105045034 A 11/2015
(Continued)

OTHER PUBLICATIONS

International Search Report and Written Opinion from PCT Application Serial No. PCT/CN2017/072194, dated May 3, 2017, 12 pages.

*Primary Examiner* — John A McPherson
(74) *Attorney, Agent, or Firm* — Kinney & Lange, P.A.

(57) ABSTRACT

A mask plate and a photo spacer and methods for preparing the same, and a display panel comprising the photo spacer are disclosed. In the mask plate, at least one exposure area is formed, the at least one exposure area comprising a central region and a peripheral region, wherein light transmittance of the central region is greater than light transmittance of the peripheral region.

15 Claims, 9 Drawing Sheets

(51) Int. Cl.
*G02F 1/1339* (2006.01)
*G03F 7/20* (2006.01)
*G02F 1/1335* (2006.01)
*G03F 7/00* (2006.01)

(52) U.S. Cl.
CPC .................. *G03F 1/50* (2013.01); *G03F 1/80* (2013.01); *G03F 7/0007* (2013.01); *G03F 7/20* (2013.01)

(58) Field of Classification Search
USPC ....................... 430/5, 320, 321, 396; 349/156
See application file for complete search history.

(56) References Cited

U.S. PATENT DOCUMENTS

| | | | | |
|---|---|---|---|---|
| 2008/0026299 | A1* | 1/2008 | Chai | G03F 1/54 430/5 |
| 2008/0266691 | A1* | 10/2008 | Kaihoko | G02B 5/205 359/885 |
| 2015/0219951 | A1* | 8/2015 | Yuan | G02F 1/13394 349/106 |
| 2017/0160634 | A1 | 6/2017 | Liu et al. | |
| 2018/0031910 | A1* | 2/2018 | Li | G02F 1/1335 |

FOREIGN PATENT DOCUMENTS

| | | | |
|---|---|---|---|
| CN | 105372867 A | * | 3/2016 |
| CN | 105824189 A | | 8/2016 |
| JP | 2004301993 A | | 10/2004 |

\* cited by examiner

Fig. 13

MASK PLATES AND PHOTO SPACERS AND METHODS FOR PREPARING THE SAME AND DISPLAY PANELS

CROSS-REFERENCE TO RELATED APPLICATION(S)

This application is a National Stage Application of PCT International ApplicationNo. PCT/CN2017/072194, filed on Jan. 23, 2017, which claims priority to the Chinese Patent Application No. 201610405123.2, filed on Jun. 8, 2016, which is incorporated herein by reference in its entirety.

TECHNICAL FIELD

The present disclosure relates to a field of optical micro-machining technology, and more particularly, to mask plates and photo spacers and methods for preparing the same, and also to display panels including the photo spacer.

BACKGROUND

Thin Film Transistor-Liquid Crystal Displays (TFT-LCD) have become the mainstream in the market due to many advantages thereof such as high picture quality, high space utilization, low power consumption, no radiation etc. In a TFT-LCD panel, a color film substrate and an array substrate are arranged opposite to each other to form a liquid crystal cell. In order to ensure a uniform thickness of the liquid crystal cell, a photo spacer (PS for short) plays an important role.

SUMMARY

The embodiments of the present disclosure provide a mask plate and a photo spacer and methods for preparing the same, and a display panel.

According to an aspect of the embodiments of the present disclosure, there is provided a mask plate. At least one exposure area is formed on the mask plate, the at least one exposure area comprising a central region and a peripheral region, wherein light transmittance of the central region is greater than light transmittance of the peripheral region.

According to another aspect of the embodiments of the present disclosure, there is provided a method for preparing a mask plate. The method comprises: forming a light shielding area and at least one exposure area on a transparent substrate, the at least one exposure area comprising a central region and a peripheral region; and processing the at least one exposure area so that light transmittance of the central region is greater than light transmittance of the peripheral region.

According to another aspect of the embodiments of the present disclosure, there is provided a method for preparing a photo spacer. The method comprises: coating negative photoresist on a substrate to form a photo spacer photoresist layer; exposing the photo spacer photoresist layer using the mask plate described above; developing the exposed photo spacer photoresist layer; and removing negative photoresist in the photo spacer photoresist layer which is not exposed and developed, and forming the photo spacer using negative photoresist which is exposed and developed.

According to another aspect of the embodiments of the present disclosure, there is provided a photo spacer. The photo spacer is prepared using the method described above.

According to another aspect of the embodiments of the present disclosure, there is provided a display panel. The display panel comprises an array substrate and a color film substrate, wherein the array substrate and the color film substrate are joined together by a cell process to form a liquid crystal cell, and the array substrate and the color film substrate are spaced apart by the photo spacer described above.

DETAILED DESCRIPTION

By taking negative photoresist as an example, a method for manufacturing a photo spacer on a color film substrate is as follows. Firstly, the negative photoresist is coated on the color film substrate, and the negative photoresist is used to form an insoluble matter upon exposure to light; and the negative photoresist is exposed and developed using a mask plate, negative photoresist which is not exposed to light is dissolved and removed, and negative photoresist below an exposure area of the mask plate is used to form the photo spacer due to insolubility.

It has been found that in a case that an exposure distance is constant, when a width of an exposure area is greater than 25 μm, a photo spacer is prepared using a semitransparent mask plate, and intensity of light transmitted through a central region of the exposure area is less than that of light transmitted through a peripheral region of the exposure area.

Figure 1A:
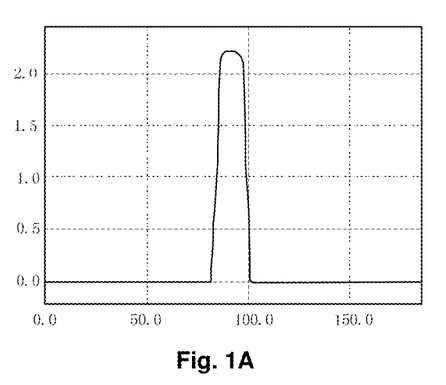
FIGS. 1A, 1B and 1C illustrate measurement diagrams of shapes of photo spacers when a conventional mask plate is used with a width of an exposure area being 25 µm, 30 µm and 35 µm, respectively.
Figure 1B:
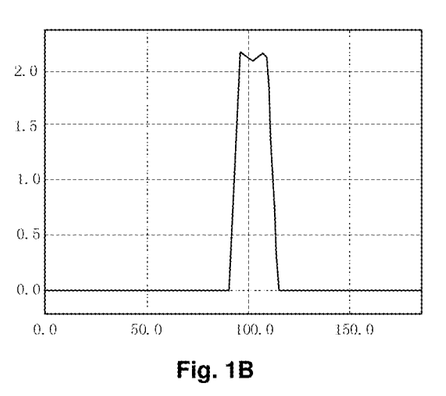
Figure 1C:
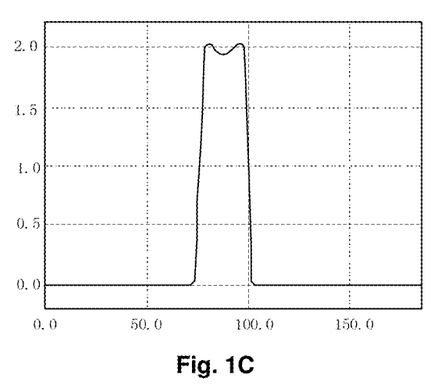

FIGS. 1A, 1B and 1C illustrate measurement diagrams of shapes of photo spacers with a width of an exposure area (if the exposure area is a circle, the width is a diameter of the circle) being 25 μm, 30 μm and 35 μm, respectively. It can be seen that when the width of the exposure area is 25 μm, the photo spacer has a normal shape. When the width of the exposure area increases to 30 μm and 35 μm, the top of the photo spacer is in a crater shape, and the larger the width of the exposure area, the more obvious the crater shape. A support effect of the photo spacer with a crater shape at the top thereof is greatly reduced, which may lead to irregularities such as Touch Mura etc. of a display panel which is sensitive to a change of an external pressure, thereby seriously affecting the picture quality of the display panel.

The embodiments of the present disclosure provide a mask plate which achieves the purpose of a uniform intensity distribution of light transmitted through the entire exposure area by enabling light transmittance of a central region of the exposure area to be greater than light transmittance of a peripheral region of the exposure area.

In order to make the purposes, technical solutions and advantages of the embodiments of the present disclosure more clear and obvious, the embodiments of the present disclosure will be described in more detail below in conjunction with specific embodiments with reference to accompanying drawings. It should be noted that the same elements are designated by the same or similar reference numerals throughout the accompanying drawings. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be noted that shapes and sizes of various components in the figures do not reflect true sizes and scales, but only illustrate contents of the embodiments of the present disclosure.

An aspect of the embodiments of the present disclosure provides a mask plate. As shown in FIGS. 2A to 2E, FIGS. 3A to 3C, and FIGS. 4A to 4C, an exposure area 30 is formed on the mask plate according to the present embodiment. The exposure area 30 includes a central region A and a peripheral region B. Light transmittance of the central region A is greater than light transmittance of the peripheral region B.

According to traditional cognition, light intensity of the exposure area of the mask plate decreases gradually from the central region to the peripheral region, corresponding photoresist below the central region is exposed to more light, and corresponding photoresist below the peripheral region is exposed to less light.

In the present embodiment, as the light transmittance of the central region A of the exposure area 30 is greater than the light transmittance of the peripheral region B of the exposure area 30, the problem that the intensity of the light transmitted through the central region A of the exposure area is weaker than that of the light transmitted through the peripheral region B is overcome, which achieves the purpose of a uniform intensity distribution of the light transmitted through the exposure area. In this way, the top of a photo spacer which is prepared using the mask plate is not in a carter shape, thereby mitigating or even avoiding occurrence of conditions such as Touch Mura etc. in the display panel.

A series of experiments show that for a photo spacer which is prepared using a mask plate with a size of an exposure area greater than 25 μm, the problem of the top of the photo spacer being in a crater shape is very serious. Therefore, in a preferred embodiment of the present disclosure, a width of the exposure area is greater than or equal to 25 μm, and more preferably, the width of the exposure area is between 25 μm and 50 μm.

In the present embodiment, the mask plate comprises a transparent substrate 10 and a light shielding layer 20 formed on the transparent substrate 10. The light shielding layer 20 is configured to form the exposure area 30 in a region on the transparent substrate through which light is at least partially transmitted, and form a light shielding area in a region on the transparent substrate by which light is completely proofed. In the mask plate for preparing the photo spacer, at least a part of the exposure area is covered with an optical semitransparent layer 31 in order to control the shape of the photo spacer.

The light shielding layer may be of the same material as that of the optical semitransparent layer 31 except that there is a difference in thickness. The light shielding layer is thick so that light used for exposure is completely proofed, and the optical semitransparent layer 31 is thin so that the light used for the exposure can be partially transmitted. In some of the accompanying drawings of the embodiments of the present disclosure, in order to distinguish between the light shielding layer and the optical semitransparent layer 31, they are filled with different patterns.

In this case, the material for preparing the light shielding layer and the optical semitransparent layer 31 may be chromium, manganese oxide, chromium, magnesium, manganese nitride, plexiglass, transparent thermosetting polymeric material, TPX, M-COC transparent materials or other high temperature-resistant and corrosion-resistant materials.

There may be the following three instances in which the thickness of the optical semitransparent layer in the central region A is less than the thickness of the optical semitransparent layer in the peripheral region B.

1. Only the peripheral region B is covered with the optical semitransparent layer 31, i.e., there is no optical semitransparent layer in the central region A of the exposure area and the peripheral region B has the optical semitransparent layer 31 formed therein.

Figure 2A:
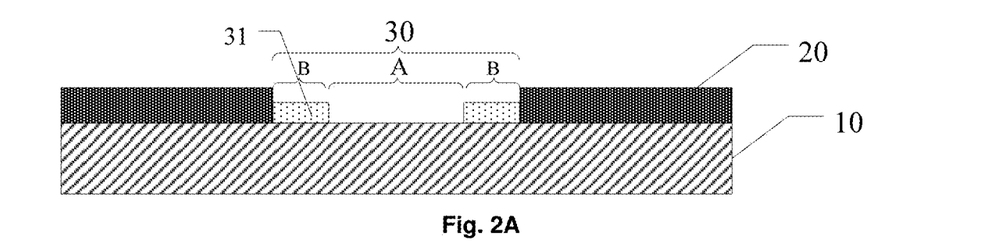
FIGS. 2A to 2E are sectional structural views of five structures of a mask plate according to an embodiment of the present disclosure in a case that no optical semitransparent layer is formed in a central region of an exposure area and an optical semitransparent layer is formed in a peripheral region of the exposure area.

FIG. 2A illustrates a sectional structural view of an exposure area according to an embodiment of the present disclosure. As shown in FIG. 2A, a width of the central region A of the exposure area is about ⅔ of a width of the entire exposure area, and widths of the peripheral region B on both sides of the exposure area are about ⅙ of the entire exposure area, respectively. There is no optical semitransparent layer in the central region A of the exposure area, that is, a thickness of the optical semitransparent layer of the central region A of the exposure area is 0. The peripheral region B of the exposure area is covered with the optical semitransparent layer 31, i.e., a thickness of the optical semitransparent layer 31 is greater than the thickness of the optical semitransparent layer in the central region A of the exposure area. There is a clear boundary between the central region A of the exposure area and the peripheral region B of the exposure area, and steps are formed therebetween.

Figure 2B:
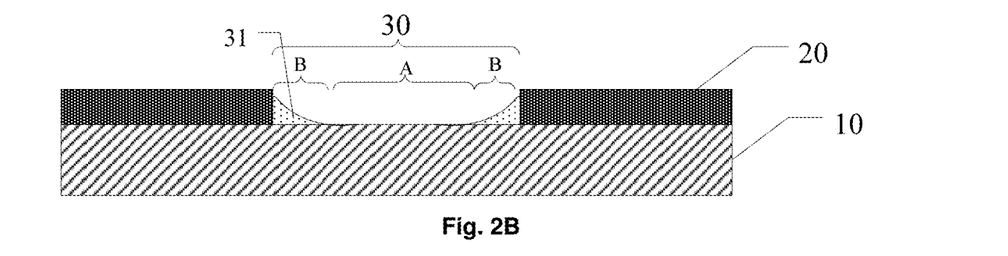

FIG. 2B illustrates a sectional structural view of an exposure area according to another embodiment of the present disclosure. The difference from the exposure area shown in FIG. 2A is that in FIG. 2B, the thickness of the optical semitransparent layer in the peripheral region B of the exposure area increases smoothly in accordance with a first curve in a direction from a center of the exposure area to an edge of the exposure area.

Although the thickness of the optical semitransparent layer in the peripheral region B of the exposure area increases smoothly in accordance with the first curve in the direction from the center of the exposure area to the edge of the exposure area in the present embodiment, the present disclosure is not limited thereto. In other embodiments of the present disclosure, the thickness of the optical semitransparent layer in the peripheral region B of the exposure area may also increase linearly or in a stepwise manner in the direction from the center of the exposure area to the edge of the exposure area, which can also achieve the present disclosure.

Figure 2C:
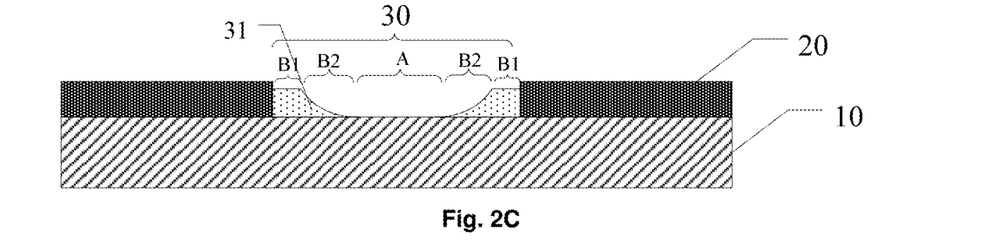

FIG. 2C illustrates a sectional structural view of an exposure area according to another embodiment of the present disclosure. The difference from the exposure area shown in FIG. 2A is that the peripheral region B includes an edge region B1 and a transition region B2. In the edge region B1, the optical semitransparent layer has a consistent thickness, and in the transition region B2, a thickness of the optical semitransparent layer increases smoothly in accordance with a second curve in the direction from the center of the exposure area to the edge of the exposure area.

As the prepared photo spacer is cylindrical or in a circular frustum shape, the exposure area on the mask plate is correspondingly circular. In this case, the thickness of the optical semitransparent layer in the transition region B2 increases smoothly in accordance with the second curve in the direction from the center of the exposure area to the edge of the exposure area, and the optical semitransparent film in the entire exposure area is in a bowl shape.

Figure 2D:
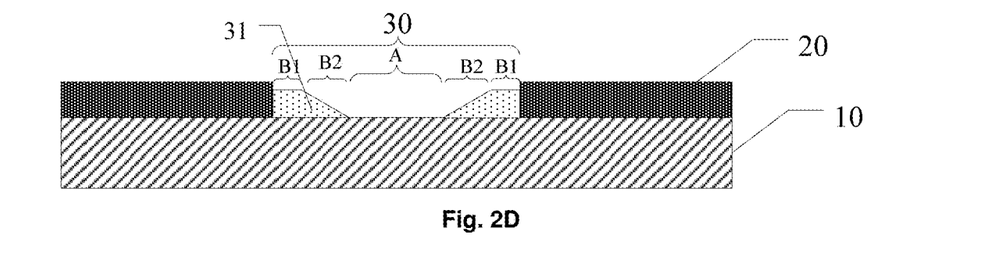

FIG. 2D illustrates a sectional structural view of an exposure area according to another embodiment of the present disclosure. The difference from the exposure area shown in FIG. 2C is that in the embodiment of FIG. 2D, the thickness of the optical semitransparent layer increases linearly in the transition region B2 in the direction from the center of the exposure area to the edge of the exposure area.

Figure 2E:
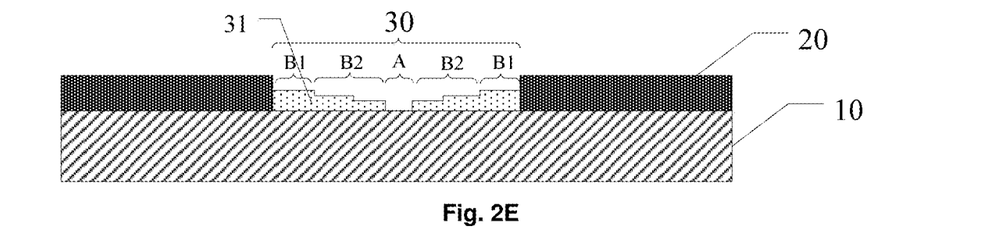

FIG. 2E illustrates a sectional structural view of an exposure area according to another embodiment of the present disclosure. The difference from the exposure area shown in FIG. 2D is that in the embodiment of FIG. 2E, the thickness of the optical semitransparent layer increases in a stepwise manner in the transition region B2 in the direction from the center of the exposure area to the edge of the exposure area.

In the mask plate, it is easy to realize the light transmittance condition by enabling the thickness of the optical semitransparent layer in the central region A of the exposure area to be less than that of the optical semitransparent layer in the peripheral region B of the exposure area.

2. Both the central region A and the peripheral region B of the exposure area have an optical semitransparent layer, and the optical semitransparent film in the central region A of the exposure area forms a concave structure.

Figure 3A:
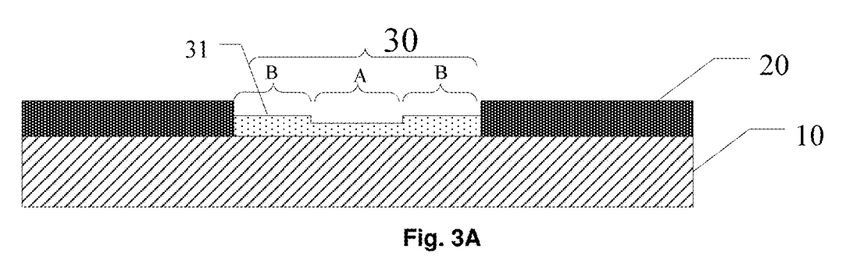
FIGS. 3A to 3C are sectional views of three structures of a mask plate according to an embodiment of the present disclosure in a case that there is an optical semitransparent layer in both a central region and a peripheral region of an exposure area.
Figure 3B:
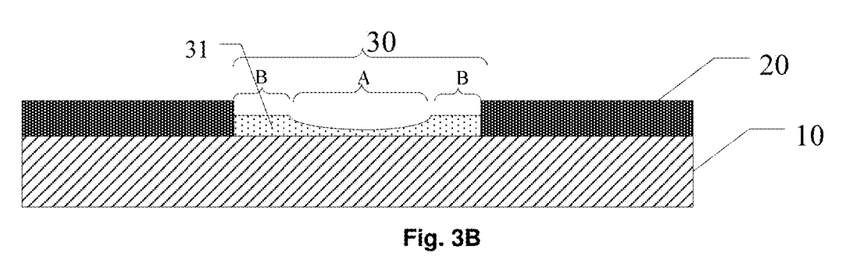
Figure 3C:
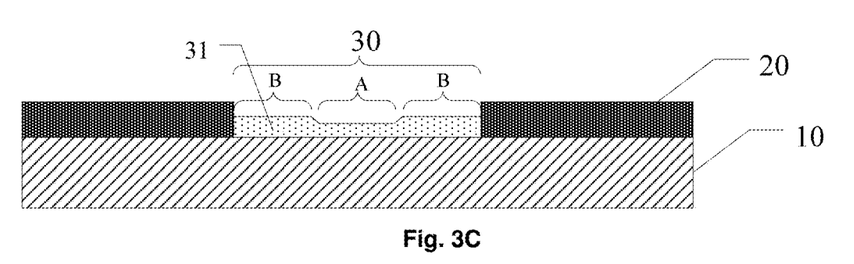

In three other instances of the present disclosure, a cross section of the concave structure may be in a rectangular shape, as shown in FIG. 3A, an arc shape, as shown in FIG. 3B, or an inverted trapezoidal shape as shown in FIG. 3C.

3. The thickness of the optical semitransparent layer increases gradually from the center of the exposure area to the edge of the exposure area.

In this case, the entire exposure area is covered with an optical semitransparent layer which forms a concave structure, so that an optical semitransparent film structure in which the thickness of the optical semitransparent layer in the central region A is less than that of the optical semitransparent layer in the peripheral region B is also formed. However, in this case, there is no strict boundary between the central region A and the peripheral region B, which thus are not shown in FIGS. 4A to 4C.

Figure 4A:
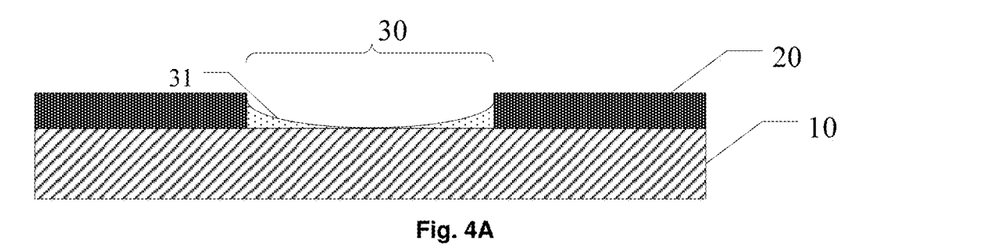
FIGS. 4A to 4C are sectional views of three structures of a mask plate according to an embodiment of the present disclosure in a case that a thickness of an optical semitransparent layer increases gradually in a direction from a center of an exposure area to an edge of the exposure area.

As shown in FIG. 4A, a longitudinal section of the concave structure is formed in an arc shape and the edge of the concave structure extends to the edge of the exposure area. I.e., the thickness of the optical semitransparent layer increases smoothly in accordance with a third curve from the center of the exposure area to the edge of the exposure area. Further, the thickness of the optical semitransparent layer is 0 at the center of the exposure area.

Figure 4B:
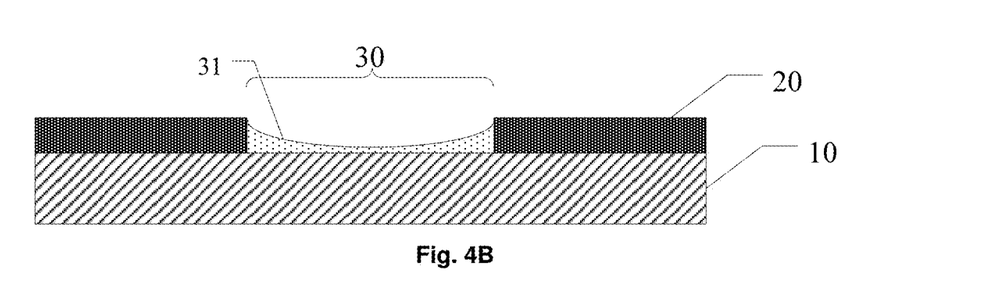

In another embodiment of the present disclosure, the difference from the structure shown in FIG. 4A is that as shown in FIG. 4B, the thickness of the optical semitransparent layer is not 0 at the center of the exposure area.

Figure 4C:
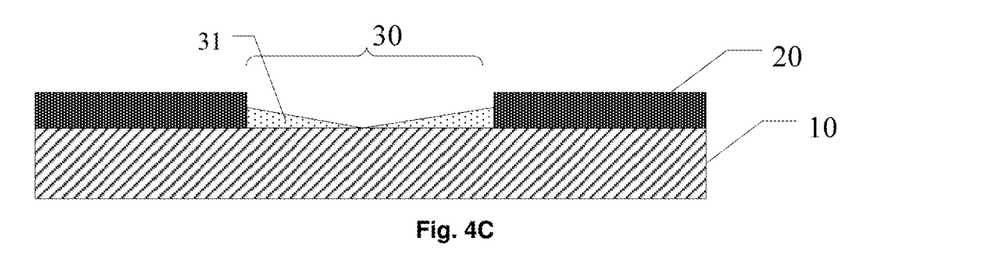

In another embodiment of the present disclosure, the difference from the structure shown in FIG. 4A is that as shown in FIG. 4C, the longitudinal section of the concave structure is formed in an inverted triangular shape, i.e., the thickness of the optical semitransparent layer increases linearly from the center of the exposure area to the edge of the exposure area.

Those skilled in the art can reasonably select, according to requirements, a specific arrangement manner of the optical semitransparent layer in the exposure area on the mask plate, a thickness and a variation rule of the optical semitransparent layer and a specific curve from the first curve, the second curve and the third curve, which will not be described in detail here.

Another aspect of the embodiments of the present disclosure further provides a mask plate different from the one described above.

Figure 9:
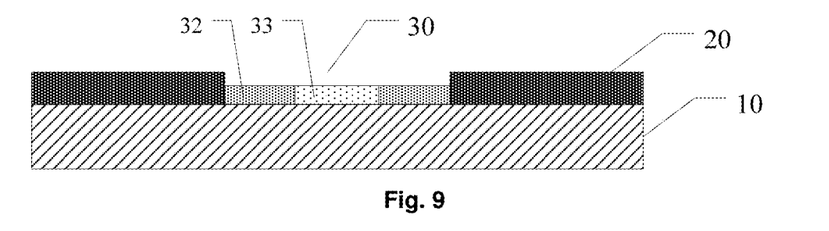
FIG. 9 is a structural view of a mask plate according to an embodiment of the present disclosure.

In the mask plate, as shown in FIG. 9, the central region A and the peripheral region B in the exposure area are covered with a first optical semitransparent layer 32 and a second optical semitransparent layer 33, respectively. The first optical semitransparent layer 32 and the second optical semitransparent layer 33 are made of different materials.

In the present embodiment, the two optical semitransparent layers may have the same thickness, but light transmittance of the first optical semitransparent layer 32 is greater than that of the second optical semitransparent layer 33 due to the difference in material. Of course, the two optical semitransparent layers may have different thicknesses, for example, the thickness of the optical semitransparent layer in the central region A is less than that of the optical semitransparent layer in the peripheral region B, and an arrangement manner may be known with reference to the above embodiment.

Of course, according to practical requirements, the mask plate according to the present disclosure further comprises other parts and structures, which will not be described here.

The method for preparing a mask plate according to an embodiment of the present disclosure will be described below.

In this preparation method, isotropic and anisotropic characteristics of an etching process are utilized. For ease of understanding, etching characteristics of dry etching and wet etching are firstly described below.

Figure 5A:
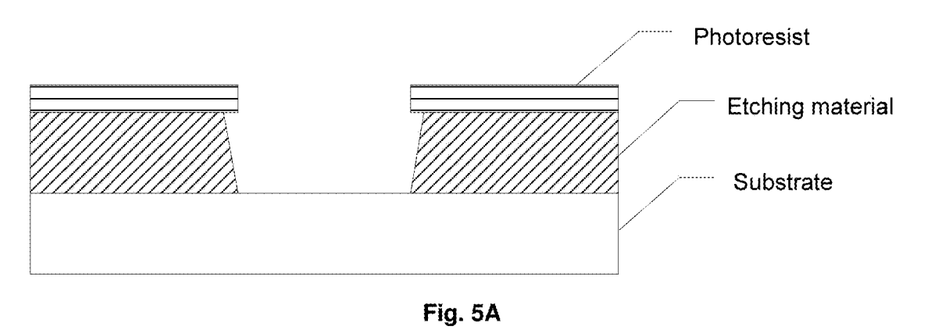
FIGS. 5A and 5B are sectional views of an etching material using dry etching and wet etching respectively.
Figure 5B:
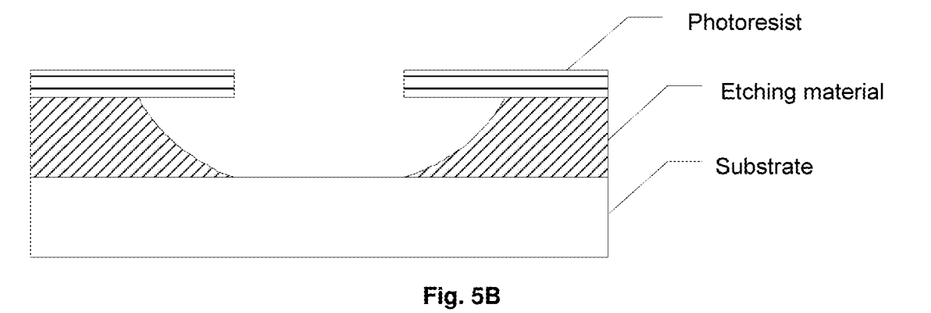

For the dry etching, a lateral corrosion rate thereof is much less than a longitudinal corrosion rate thereof, and therefore the etching has anisotropic characteristics and sidewalls of an etched region are steep, as shown in FIG. 5A. For the wet etching, lateral and longitudinal corrosion rates thereof are substantially the same, and therefore the etching has isotropic characteristics, and sidewalls of an etched region are smooth and are in an arc shape, as shown in FIG. 5B.

Figure 6:
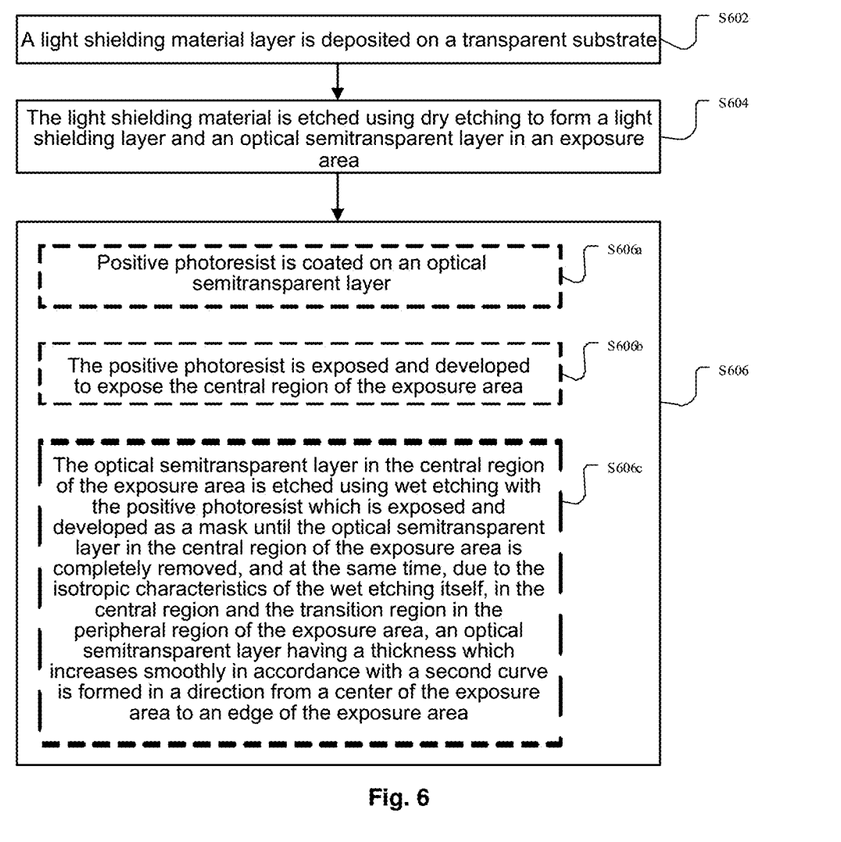
FIG. 6 is a flowchart of a method for preparing a mask plate according to an embodiment of the present disclosure.

As shown in FIGS. 2C, 6 and 7, the method for preparing a mask plate according to the present embodiment includes the following steps.

Figure 7A:
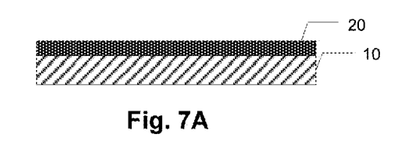
FIG. 7 is sectional views of a device after various steps of the method for preparing a mask plate shown in FIG. 6 are performed.

In step S602, a light shielding material layer is deposited on a transparent substrate 10, which results in a structure shown in FIG. 7A.

Figure 7B:
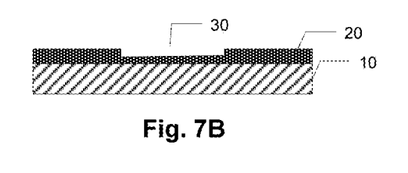

In step S604, the light shielding material is etched using dry etching to form a light shielding layer 20 and an optical semitransparent layer in an exposure area, which results in a structure shown in FIG. 7B.

In this step, the light shielding material is etched by the dry etching using a gas such as $CF_6/O_2/Cl_2$ etc. in a plasma environment with an etching temperature between 30° C. and 80° C. and an etching rate between 30 Å/s and 200 Å/s.

Figure 7C:
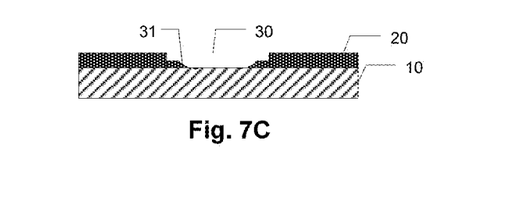

In step S606, the optical semitransparent layer in a central region A of the exposure area is etched using wet etching until the optical semitransparent layer in the central region A of the exposure area is completely removed, and at this time, due to the isotropic characteristics of the wet etching itself, in a transition region B2 in a peripheral region B of the exposure area, an optical semitransparent layer having a thickness which increases smoothly in accordance with a second curve is formed in a direction from a center of the exposure area to an edge of the exposure area, which results in a structure shown in FIG. 7C.

With respect to the steps S602 to S604 therein, they may be implemented using commonly-used technical measure in the art. With respect to the step S606, in the present embodiment, the optical semitransparent layer on the mask plate is formed at one time by controlling process conditions of the wet etching.

Continuing with FIG. 6, in the present embodiment, the step S606 further includes the following sub-steps.

In sub-step S606a, positive photoresist is coated on an optical semitransparent layer.

In sub-step S606b, the positive photoresist is exposed and developed to expose the central region A of the exposure area.

In sub-step S606c, the optical semitransparent layer in the central region A of the exposure area is etched using wet etching with the positive photoresist which is exposed and developed as a mask until the optical semitransparent layer in the central region A of the exposure area is completely removed, and at this time, due to the isotropic characteristics of the wet etching itself, in the transition region B2 in the peripheral region B of the exposure area, an optical semi-transparent layer having a thickness which increases smoothly in accordance with a second curve is formed in a direction from a center of the exposure area to an edge of the exposure area, which results in a structure shown in FIG. 7C.

In the present step, the wet etching is carried out in an acidic etching solution such as sulfuric acid/nitric acid/phosphoric acid etc., the etching temperature is between 50° C. and 80° C. and the etching rate is between 50 Å/s and 200 Å/s.

According to practical requirements, the method for preparing a mask plate according to the present disclosure further comprises other steps and processes, which will not be described here.

In the present embodiment, the mask plate is prepared using the isotropic characteristics of the wet etching, and the mask plate can be prepared using an etching process at a time, which simplifies the production process of the mask plate and reduces the cost.

According to the method of the present embodiment, the mask plates shown in FIGS. 2B, 2C, 2D, 3B, 3C, 4A and 4B may also be prepared by controlling etching conditions, which will not be described here individually.

Another method for preparing a mask plate according to an embodiment of the present disclosure will be described below.

The preparation method differs from the previous preparation method in that the light shielding layer and the optical semitransparent layer are films which are prepared using different materials. As shown in FIGS. 2C and 8, the method for preparing a mask plate according to the present embodiment includes the following steps.

Figure 8A:
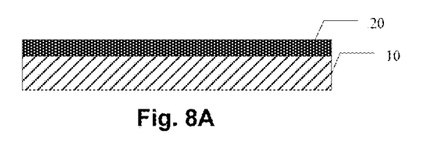
FIG. 8 is sectional views of a device after various steps of a method for preparing a mask plate according to another embodiment of the present disclosure are performed.

A light shielding material layer is deposited on a transparent substrate 10, which results in a structure shown in FIG. 8A.

Figure 8B:
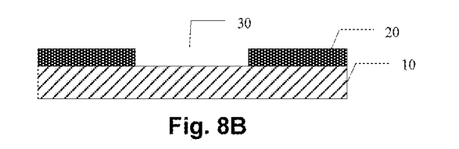

The light shielding material is etched using the dry etching to form a light shielding layer 20 and an exposure area 30, which results in a structure shown in FIG. 8B.

Figure 8C:
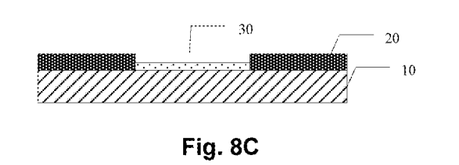

A optical semitransparent film is deposited in the exposure area, which results in a structure as shown in FIG. 8C.

Figure 8D:
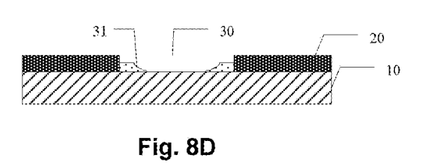

The optical semitransparent layer in a central region A of the exposure area is etched using the wet etching until the optical semitransparent layer in the central region A of the exposure area is completely removed, and at this time, due to isotropic characteristics of the wet etching itself, in a transition region B2 of a peripheral region B of the exposure area, an optical semitransparent layer having a thickness which increases smoothly in accordance with a second curve is formed in a direction from a center of the exposure area to an edge of the exposure area, which results in a structure shown in FIG. 8D.

In the present embodiment, process parameters of the dry etching and the wet etching can be known with reference to the related description of the previous embodiment, and will not be repeated here.

Similarly, the mask plates shown in FIGS. 2B, 2C, 2D, 3B, 3C, 4A and 4B can also be prepared by controlling the etching conditions in a manner similar to that of the present embodiment, which will not be described here respectively.

The mask plates shown in FIGS. 2A, 2E, 3A, and 4C can be realized using the dry etching. In particular, for the structure shown in FIG. 2E or FIG. 4C, it is necessary to carry out the dry etching many times.

In addition, it is necessary to prepare a first optical semitransparent layer 32 and a second optical semitransparent layer 33 respectively in the preparation of the mask plate (with a central region A and a peripheral region B being covered with optical semitransparent layers of different materials) in another aspect of the embodiments of the present disclosure. An advantage of this solution is that precise control of shapes of the optical semitransparent layers can be realized, thus achieving precise control of amounts of light transmitted through various regions in the exposure area.

In the embodiment of the method for preparing a mask plate, the exposure area is processed correspondingly, for example, the exposure area is processed to enable a thickness of the optical semitransparent layer in the central region A to be less than a thickness of the optical semitransparent layer in the peripheral region B, or to enable light transmittance of a material of the first optical semitransparent layer 32 which covers the central region A to be greater than light transmittance of a material of the second optical semitransparent layer 33 which covers the peripheral region B. Of course, the processing method is not limited thereto, for example, only the peripheral region B is covered with an optical semitransparent layer.

Figure 10:
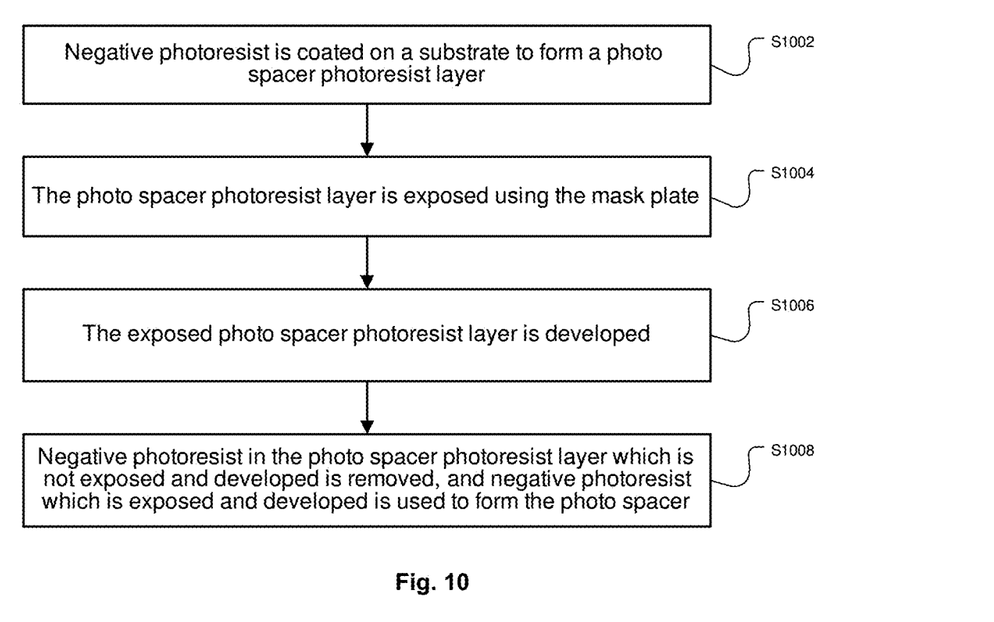
FIG. 10 is a flowchart of a method for preparing a photo spacer according to an embodiment of the present disclosure.
Figure 11:
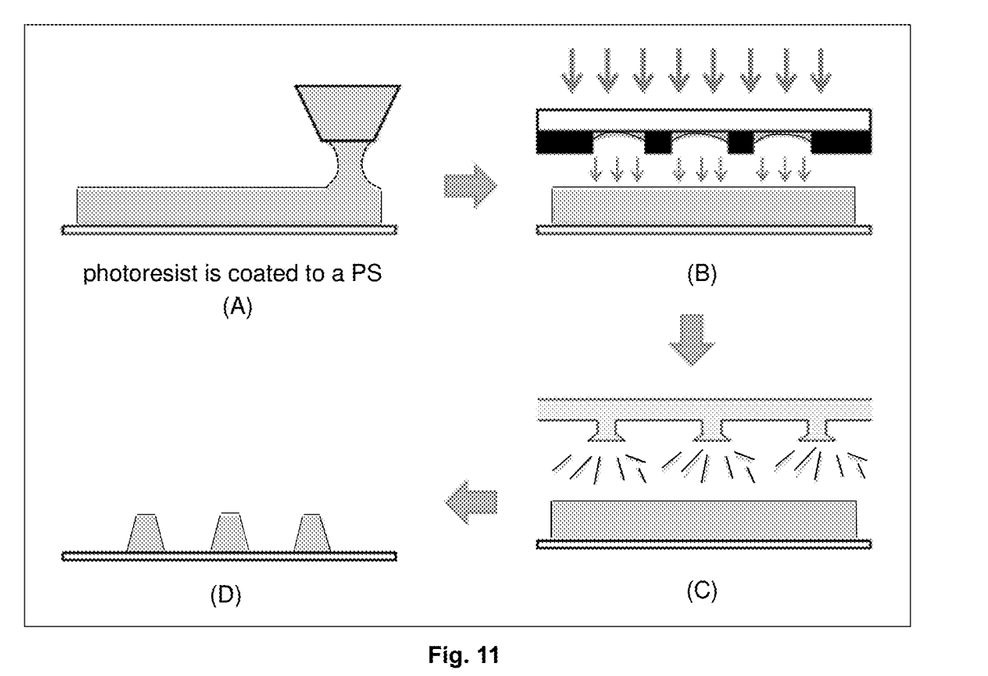
FIG. 11 is sectional views of a device after various steps of the method for preparing a photo spacer shown in FIG. 10 are performed.

Another aspect of the embodiments of the present disclosure further provides a method for preparing a photo spacer using a mask plate according to an embodiment of the present disclosure. As shown in FIGS. 10 and 11, the method of preparing a photo spacer according to the present embodiment comprises the following steps.

In step S1002, negative photoresist is coated on a substrate to form a photo spacer photoresist layer, which results in a structure shown in (A) of FIG. 11.

In step S1004, the photo spacer photoresist layer is exposed using the mask plate according to the embodiment of the present disclosure, which results in a structure shown in (B) of FIG. 11.

In step S1006, the exposed photo spacer photoresist layer is developed, which results in a structure shown in (C) of FIG. 11.

In step S1008, negative photoresist in the photo spacer photoresist layer which is not exposed and developed is removed, negative photoresist in the photo spacer photoresist layer which is exposed and developed is used to form the photo spacer, which results in a structure shown in (D) of FIG. 11.

Figure 12:
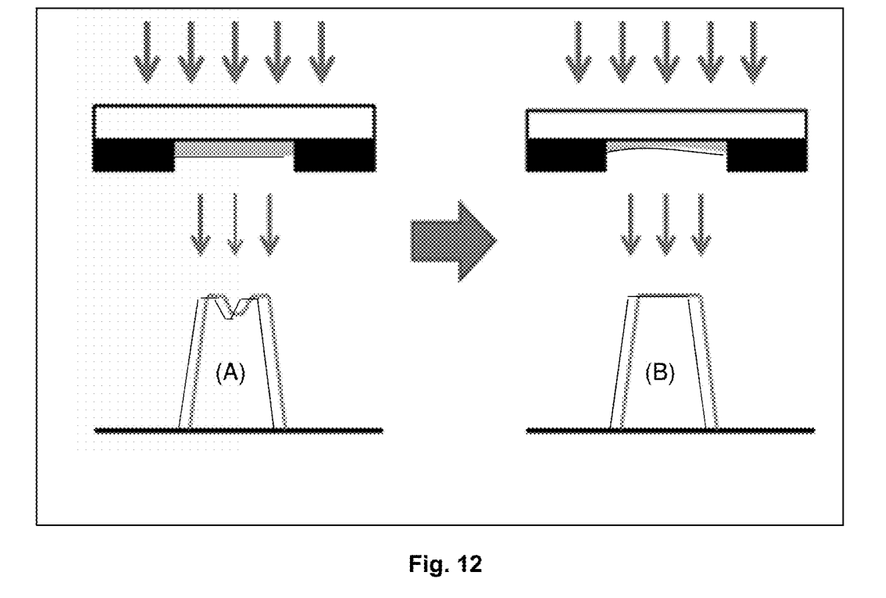
FIG. 12 is a structural contrast diagram of photo spacers prepared using a conventional mask plate and a mask plate according to the present disclosure.

FIG. 12 is a structural contrast diagram of photo spacers prepared using a conventional mask plate and a mask plate according to the present disclosure. In FIG. 12, (A) is a photo spacer prepared using the conventional mask plate, and it can be seen that the top of the photo spacer is in a crater shape as light intensity in the opening central region A is less than that in other regions. In FIG. 12, (B) is a photo spacer prepared using the mask plate according to the first embodiment. It can be seen that light transmittance of the central region A of the exposure area is greater than light transmittance of the peripheral region B of the exposure area, so that a uniform intensity distribution of light transmitted through the entire exposure area is achieved. The top of the photo spacer is no longer in a crater shape, but is in a flat shape. In this way, when the photo spacer is applied with an external force, the entire top of the photo spacer is applied with the force uniformly, and hardness of the photo spacer changes linearly, which avoids or mitigates irregularities such as Touch Mura etc. of the display panel which is sensitive to a change of an external pressure.

It should be noted that various types of structures can be prepared using the mask plate according to the embodiment, and the photo spacer for preparing the color film substrate is only a special structure of all the structures and should not be construed as limiting the protection scope of the embodiments of the present disclosure.

Another aspect of the embodiments of the present disclosure further provides a photo spacer. The photo spacer is prepared using the method according to the embodiment described above.

Another aspect of the embodiments of the present disclosure further provides a display panel. The display panel comprises an array substrate and a color film substrate. The array substrate and the color film substrate are joined together by a cell process to form a liquid crystal cell. The array substrate and the color film substrate are spaced apart by a photo spacer according to an embodiment of the present disclosure.

Of course, according to practical requirements, the display panel according to the embodiments of the present disclosure may further comprises other parts and structures, which will not be described herein.

Figure 13:
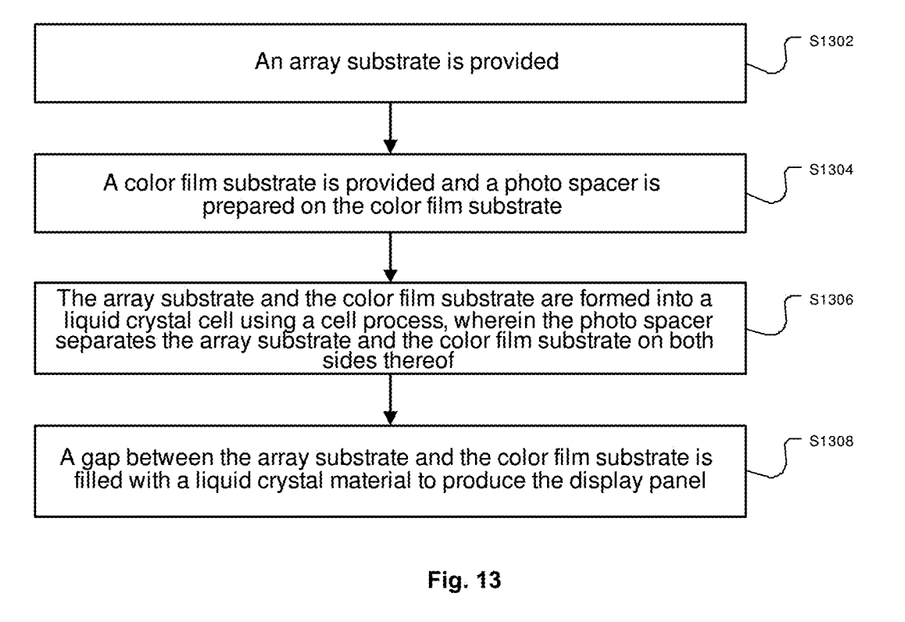
FIG. 13 is a flowchart of a method for preparing a display panel according to another embodiment of the present disclosure.

Another aspect of the embodiments of the present disclosure further provides a method for preparing a display panel. As shown in FIG. 13, the method for preparing a display panel according to the present embodiment includes the following steps.

In step S1302, an array substrate is provided.

In step S1304, a color film substrate is provided and a photo spacer is prepared on the color film substrate using the method according to the embodiment of the present disclosure.

In step S1306, the array substrate and the color film substrate are formed into a liquid crystal cell using a cell process, wherein the photo spacer separates the array substrate and the color film substrate on both sides thereof to ensure a uniform thickness of the liquid crystal cell.

In step S1308: a gap between the array substrate and the color film substrate is filled with a liquid crystal material to produce the display panel.

Of course, according to practical requirements, the method for preparing a display panel according to the present disclosure further includes other processes and steps, which will not be described here.

Definitions of various elements and methods described above are not limited to the specific structures, shapes or manners mentioned in the embodiments, and one of ordinary skill in the art can simply make changes or substitutions thereto. For example:

(1) A shape of the concave structure of the optical semitransparent layer in the exposure area may be selected as required or may be adjusted in accordance with experimental results as long as the light transmittance of the central region A is greater than the light transmittance of the peripheral region B;

(2) The first curve, the second curve, and the third curve may be selected from one of the following curvatures: arc curve, elliptic curve, involute and hyperbola;

(3) In the central region A and the peripheral region B, it is not excluded that an extremely small region (with an area less than 10% of an effective area) is intentionally or unintentionally not designed according to the rule that the thickness of the optical semitransparent layer increases from the inside to the outside, as the extremely small area does not have much impact on the light transmittance;

(4) Areas occupied by the central region A and the peripheral region B can be adjusted by a person skilled in the art as required, and are not limited to proportions of the areas given in the embodiments of the present disclosure;

(5) The embodiments are described by taking a mask plate comprised of a transparent substrate and a light shielding layer as an example. and are within the protection scope of the embodiments of the present disclosure as long as they satisfy the conditions of the light transmittance which are emphasized in the embodiments of the present disclosure.

In addition, a demonstration of parameters which contain specific values can be provided herein, but these parameters need not be exactly equal to the corresponding values, but may be approximated to the corresponding values within acceptable error tolerances or design constraints. The direction terms mentioned in the embodiments, such as "up", "down", "front", "rear", "left", "right" etc., are merely directions for referring to the accompanying drawings, and are not intended to limit the protection scope of the present disclosure. Further, an order of the above steps is not limited to those listed above and may be varied or rearranged according to the desired design, unless otherwise specifically described or an order of the steps must be followed.

In view of the above, the embodiments of the present disclosure provides a novel mask plate which achieves the purpose of a uniform intensity distribution of light transmitted through the entire exposure area by enabling the light transmittance of the central region of the exposure area to be greater than the light transmittance of the peripheral region of the exposure area. When the photo spacer is prepared on the color film substrate using the mask plate, the top of the photo spacer is in a flat shape so that the hardness of the photo spacer changes linearly when the photo spacer is applied with an external force, which avoids or mitigates mura such as Touch Mura etc. of the display panel which is sensitive to a change of an external pressure. In addition, the mask plate is prepared using the isotropic characteristics of the wet etching, and the mask plate can be prepared using an etching process at a time, which simplifies the production process of the mask plate and reduces the cost. The embodiments of the present disclosure have potential application values not only in the preparation of the color film substrate but also in various fields of application of the photolithography process.

The foregoing detailed description further describes the purposes, technical solutions and advantages of the embodiments of the present disclosure in detail, and it is to be understood that the foregoing is only specific embodiments of the embodiments of the present disclosure and is not intended to limit the present disclosure. Any modifications, equivalent substitutions, improvements, etc. within the spirit and principles of the embodiments of the present disclosure are intended to be included within the protection scope of the embodiments of the present disclosure.

We claim:

1. A mask plate having at least one exposure area formed thereon, the at least one exposure area comprising a central region and a peripheral region, wherein
at least a part of the exposure area is covered with an optical semitransparent layer and at least a part of the optical semitransparent layer has a thickness increasing gradually in a direction from a center of the exposure area to an edge of the exposure area, such that light transmittance of the central region is greater than light transmittance of the peripheral region.

2. The mask plate according to claim 1, wherein both the central region and the peripheral region are covered with the optical semitransparent layer, and the optical semitransparent layer in the central region forms a concave structure.

3. The mask plate according to claim 2, wherein a longitudinal section of the concave structure is in a rectangular, arc or inverted trapezoidal shape.

4. The mask plate according to claim 1, wherein only the peripheral region is covered with the optical semitransparent layer.

5. The mask plate according to claim 4, wherein steps are formed between the central region and the peripheral region; or
a thickness of the optical semitransparent layer in the peripheral region increases smoothly, linearly or in a stepwise manner in accordance with a preset first curve in a direction from a center of the exposure area to an edge of the exposure area; or
the peripheral region comprises an edge region and a transition region, wherein the optical semitransparent layer in the edge region has a consistent thickness, and in the transition region, a thickness of the optical semitransparent layer increases smoothly, linearly or in a stepwise manner in accordance with a preset second curve in the direction from the center of the exposure area to the edge of the exposure area.

6. The mask plate according to claim 1, wherein the optical semitransparent layer forms a concave structure having an edge extending to the edge of the exposure area, wherein
the thickness of the optical semitransparent layer increases smoothly, linearly or in a stepwise manner in accordance with a preset third curve in the direction from the center of the exposure area to the edge of the exposure area.

7. The mask plate according to claim 1, comprising a transparent substrate and a light shielding layer formed on the transparent substrate, wherein
the light shielding layer is configured to form a light shielding area and the at least one exposure area on the transparent substrate, and wherein
the light shielding layer is made of a material different from that of the optical semitransparent layer; or
the light shielding layer is made of the same material as that of the optical semitransparent layer, wherein a thickness of the material in the light shielding area enables light used for exposure to be completely proofed, and in the exposure area, the thickness of the material enables the light used for the exposure to be partially or completely transmitted.

8. The mask plate according to claim 1, wherein the central region is covered with a first optical semitransparent layer and the peripheral region is covered with a second optical semitransparent layer,
wherein the first optical semitransparent layer is made of a material different from that of the second optical semitransparent layer, and light transmittance of the first optical semitransparent layer is greater than light transmittance of the second optical semitransparent layer.

9. The mask plate according to claim 1, wherein the exposure area has a width greater than 25 μm.

10. The mask plate according to claim 9, wherein the exposure area has a width between 25 μm and 50 μm.

11. A method for preparing a mask plate, comprising:
forming a light shielding area and at least one exposure area on a transparent substrate, the at least one exposure area comprising a central region and a peripheral region; and
processing the at least one exposure area so that light transmittance of the central region is greater than light transmittance of the peripheral region;
wherein processing the at least one exposure area so that light transmittance of the central region is greater than light transmittance of the peripheral region comprises:
forming an optical semitransparent layer within the at least one exposure area; and
etching the optical semitransparent layer so that at least a part of the optical semitransparent layer has a thickness increasing gradually in a direction from a center of the exposure area to an edge of the exposure area.

12. The method according to claim 11, wherein the step of etching the optical semitransparent layer comprises:
etching the optical semitransparent layer in the central region using wet etching.

13. The method according to claim 11, wherein
forming a light shielding area and at least one exposure area on a transparent substrate comprises: depositing a light shielding material on the transparent substrate, and completely etching the light shielding material in a preset region to form the at least one exposure area, and forming the light shielding area in a region other than the preset region; and forming an optical semitransparent layer within the at least one exposure area comprises: depositing the optical semitransparent layer within the at least one exposure area.

14. The method according to claim 11, wherein forming a light shielding area and at least one exposure area on a transparent substrate and forming an optical semitransparent layer within the at least one exposure area comprises:

depositing a light shielding material on the transparent substrate; and partly etching the light shielding material in a preset region so that a thickness of the light shielding material enables light used for exposure to be partially or completely transmitted to form the at least one exposure area and form the optical semitransparent layer in the at least one exposure area, and forming the light shielding area in a region other than the preset region.

15. A method for preparing a photo spacer, comprising:

coating negative photoresist on a substrate to form a photo spacer photoresist layer;

exposing the photo spacer photoresist layer using the mask plate according to claim 1;

developing the exposed photo spacer photoresist layer; and removing negative photoresist in the photo spacer photoresist layer which is not exposed and developed, and forming the photo spacer using negative photoresist which is exposed and developed.

* * * * *